(12) United States Patent
Cui et al.

(10) Patent No.: US 11,869,990 B2
(45) Date of Patent: Jan. 9, 2024

(54) DISPLAY PANEL HAVING UPCONVERSION MATERIAL AND DISPLAY DEVICE

(71) Applicant: Shenzhen China Star Optoelectronics Semiconductor Display Technology Co., Ltd., Shenzhen (CN)

(72) Inventors: Wei Cui, Shenzhen (CN); Miao Jiang, Shenzhen (CN); Jiangbo Yao, Shenzhen (CN); Lixuan Chen, Shenzhen (CN); Xin Zhang, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/055,565

(22) PCT Filed: Oct. 14, 2020

(86) PCT No.: PCT/CN2020/120905
§ 371 (c)(1),
(2) Date: Nov. 14, 2020

(87) PCT Pub. No.: WO2022/047898
PCT Pub. Date: Mar. 10, 2022

(65) Prior Publication Data
US 2023/0187565 A1 Jun. 15, 2023

(30) Foreign Application Priority Data
Jan. 9, 2020 (CN) .......................... 202010904088.5

(51) Int. Cl.
*H01L 31/0232* (2014.01)
*G06F 3/042* (2006.01)
(Continued)

(52) U.S. Cl.
CPC ........ *H01L 31/02322* (2013.01); *G01B 7/003* (2013.01); *G06F 3/042* (2013.01); *G06F 3/0412* (2013.01); *H01L 31/1136* (2013.01)

(58) Field of Classification Search
CPC ........... H01L 31/02322; H01L 31/1136; G06F 3/042; G06F 3/0304; G01B 7/003
See application file for complete search history.

(56) References Cited

U.S. PATENT DOCUMENTS

2016/0064456 A1   3/2016  Lee et al.
2018/0150163 A1*  5/2018  Lee ...................... G06F 3/0412
(Continued)

FOREIGN PATENT DOCUMENTS

CN      101068040 A    11/2007
CN      101211083 A1   7/2008
(Continued)

*Primary Examiner* — Jennifer D Bennett
*Assistant Examiner* — Erin R Garber
(74) *Attorney, Agent, or Firm* — Nathan & Associates; Menachem Nathan

(57) ABSTRACT

A display panel and a display device are provided. In the display panel, an upconversion material layer is configured to convert interactive light from a first wave band into a second wave band. A light-sensing transistor of a light-sensing circuit is configured to convert a light intensity signal of the interactive light into an electrical signal after the wave band of the interactive light is converted. A position-detecting circuit is configured to identify a position where the interactive light is irradiated according to the electrical signal. Therefore, the display panel can interact with light having relatively long wavelengths.

17 Claims, 4 Drawing Sheets a b

(51) Int. Cl.
*H01L 31/113* (2006.01)
*G01B 7/00* (2006.01)
*G06F 3/041* (2006.01)

(56) References Cited

U.S. PATENT DOCUMENTS

| | | | | |
|---|---|---|---|---|
| 2020/0074139 A1* | 3/2020 | Zhou | ................... | H10K 59/65 |
| 2020/0183063 A1* | 6/2020 | Zhu | ................... | G02B 5/284 |
| 2020/0326593 A1* | 10/2020 | Gao | ................... | G02F 1/133606 |
| 2021/0141487 A1* | 5/2021 | Huang | ................ | H10K 59/351 |
| 2022/0069025 A1* | 3/2022 | Yamazaki | .............. | H10K 59/30 |

FOREIGN PATENT DOCUMENTS

| | | | |
|---|---|---|---|
| CN | 101414068 | A | 4/2009 |
| CN | 102820365 | A | 12/2012 |
| CN | 103311358 | A | 9/2013 |
| CN | 107479760 | A | 12/2017 |
| CN | 108010493 | A | 5/2018 |
| CN | 108649059 | A | 10/2018 |
| CN | 108846392 | A | 11/2018 |
| CN | 109728151 | A | 5/2019 |
| CN | 10945661 | A | 3/2020 |
| CN | 110911464 | A | 3/2020 |
| CN | 111244196 | A | 6/2020 |
| CN | 111399292 | A | 7/2020 |
| CN | 111524916 | A | 8/2020 |
| WO | 2015143011 | A1 | 9/2015 |

\* cited by examiner a b

DISPLAY PANEL HAVING UPCONVERSION MATERIAL AND DISPLAY DEVICE

FIELD

The present disclosure relates to the field of display technologies, and more particularly, relates to a display panel and a display device.

BACKGROUND

With development of display technologies, display devices having interactive functions have attracted increasing attention. Compared with conventional polysilicon transistors, metal oxide transistors have improved electron mobility and stability, and therefore are widely used in display panels. However, a metal oxide active layer of the metal oxide transistors has a relatively wide bandgap, so the metal oxide active layer can only absorb ultraviolet light that has relatively wavelengths, but cannot absorb visible light. As a result, the metal oxide transistors are not suitable for being a light-sensing device, limiting interactive applications of display panels having the metal oxide transistors in terms of visible light and near infrared light.

Therefore, a following issue needs to be addressed: a wavelength range of interactable light in conventional display panels is relatively narrow.

SUMMARY

Embodiments of the present disclosure provide a display panel and a display device to alleviate a following technical problem: a wavelength range of interactable light of conventional display panels is relatively narrow.

To solve the above problem, technical solutions provided by the present disclosure are described as follows:

The present disclosure provides a display panel, including a plurality of light-sensing areas arranged in an array manner, wherein the display panel includes:

an upconversion material layer, wherein the upconversion material layer is configured to absorb interactive light emitted from an interactive light source and convert the interactive light from a first wave band into a second wave band, and the second wave band is less than the first wave band;

a light-sensing circuit, wherein the light-sensing circuit is disposed in the light-sensing areas and includes a light-sensing transistor, the light-sensing transistor includes a substrate, a metal oxide active layer, a gate insulating layer, a gate layer, and a source/drain layer, the upconversion material layer is disposed between the interactive light source and the metal oxide active layer, the second wave band is within an absorption band of the metal oxide active layer, and the light-sensing transistor is configured to convert a light intensity signal of the interactive light into an electrical signal; and a position-detecting circuit, wherein the position-detecting circuit is electrically connected to the light-sensing circuit and is configured to identify a position where the interactive light is irradiated.

In the display panel, the upconversion material layer includes an upconversion nanomaterial doped with a lanthanide.

In the display panel, the upconversion nanomaterial doped with the lanthanide includes $NaYF_4$:Yb, Tm, Er, and mass fractions of Yb, Tm, and Er are 25%, 0.5%, and 0.1%, respectively.

In the display panel, the upconversion material layer further includes polymethylmethacrylate.

In the display panel, the light-sensing transistor includes the substrate, the gate insulating layer, and the source/drain layer, which are stacked, one of the gate layer or the metal oxide active layer is disposed between the substrate and the gate insulating layer, and the other is disposed between the gate insulating layer and the source/drain layer.

In the display panel, the upconversion material layer is disposed in the light-sensing transistor and is disposed on a side of the metal oxide active layer away from the substrate.

In the display panel, the upconversion material layer is disposed on a light-emitting surface of the display panel.

In the display panel, a material of the metal oxide active layer includes at least one of indium tin oxide, indium zinc oxide, indium gallium zinc oxide, indium zinc tin oxide, or indium gallium zinc tin oxide.

In the display panel, the light-sensing circuit further includes a first switch transistor, a gate of the light-sensing transistor is connected to a scan signal line, a first electrode of the light-sensing transistor is connected to a high potential power signal line, a second electrode of the light-sensing transistor is connected to a gate of the first switch transistor, a first electrode of the first switch transistor is connected to the high potential power signal line, a second electrode of the first switch transistor is connected to an electrical signal reading line, and the electrical signal reading line is connected to the position-detecting circuit.

In the display panel, the light-sensing circuit further includes a second switch transistor and a storage capacitor, the gate of the light-sensing transistor is connected to a scan signal line, a first electrode of the light-sensing transistor is connected to a first data signal line, a second electrode of the light-sensing transistor is connected to a first electrode of the second switch transistor, a gate of the second switch transistor is connected to a second data signal line, a second electrode of the second switch transistor is connected to an electrical signal reading line, a first electrode of the storage capacitor is connected to the first data signal line, a second electrode of the storage capacitor is connected to the second electrode of the light-sensing transistor, and the electrical signal reading line is connected to the position-detecting circuit.

In the display panel, the position-detecting circuit includes an integrator.

In the display panel, the display panel further includes an array substrate, and the light-sensing circuit is disposed in the array substrate.

In the display panel, the plurality of light-sensing circuits form a light-sensing layer disposed on a light-emitting surface of the display panel and electrically connected to the display panel.

In the display panel, the light-sensing areas correspond to one or more pixels.

The present disclosure further provides a display device, including a display panel and a driver chip, wherein the display panel includes:

an upconversion material layer, wherein the upconversion material layer is configured to absorb interactive light emitted from an interactive light source and convert the interactive light from a first wave band into a second wave band, and the second wave band is less than the first wave band;

a light-sensing circuit, wherein the light-sensing circuit is disposed in the light-sensing areas and includes a light-sensing transistor, the light-sensing transistor includes a substrate, a metal oxide active layer, a gate insulating layer, a gate layer, and a source/drain layer, the upconversion material layer is disposed between the interactive light source and the metal oxide active layer, the second wave band is within an absorption band of the metal oxide active layer, and the light-sensing transistor is configured to convert a light intensity signal of the interactive light into an electrical signal; and a position-detecting circuit, wherein the position-detecting circuit is electrically connected to the light-sensing circuit and is configured to identify a position where the interactive light is irradiated.

In the display device, the upconversion material layer includes an upconversion nanomaterial doped with a lanthanide.

In the display device, the upconversion nanomaterial doped with the lanthanide includes NaYF4:Yb, Tm, Er, and mass fractions of Yb, Tm, and Er are 25%, 0.5%, and 0.1%, respectively.

In the display device, wherein the light-sensing transistor includes the substrate, the gate insulating layer, and the source/drain layer, which are stacked, one of the gate layer or the metal oxide active layer is disposed between the substrate and the gate insulating layer, and the other is disposed between the gate insulating layer and the source/drain layer.

In the display device, the light-sensing circuit further includes a first switch transistor, a gate of the light-sensing transistor is connected to a scan signal line, a first electrode of the light-sensing transistor is connected to a high potential power signal line, a second electrode of the light-sensing transistor is connected to a gate of the first switch transistor, a first electrode of the first switch transistor is connected to the high potential power signal line, a second electrode of the first switch transistor is connected to an electrical signal reading line, and the electrical signal reading line is connected to the position-detecting circuit.

In the display device, the light-sensing circuit further includes a second switch transistor and a storage capacitor, the gate of the light-sensing transistor is connected to a scan signal line, a first electrode of the light-sensing transistor is connected to a first data signal line, a second electrode of the light-sensing transistor is connected to a first electrode of the second switch transistor, a gate of the second switch transistor is connected to a second data signal line, a second electrode of the second switch transistor is connected to an electrical signal reading line, a first electrode of the storage capacitor is connected to the first data signal line, a second electrode of the storage capacitor is connected to the second electrode of the light-sensing transistor, and the electrical signal reading line is connected to the position-detecting circuit.

Regarding the beneficial effects: the present disclosure provides a display panel and a display device. The display panel includes an upconversion material layer, a light-sensing circuit, and a position-detecting circuit. The upconversion material layer is configured to absorb interactive light emitted from an interactive light source and convert the interactive light from a first wave band into a second wave band. The second wave band is less than the first wave band. The light-sensing circuit is disposed in the light-sensing areas and includes a light-sensing transistor. The light-sensing transistor includes a substrate, a metal oxide active layer, a gate insulating layer, a gate layer, and a source/drain layer. The upconversion material layer is disposed between the interactive light source and the metal oxide active layer. The second wave band is within an absorption band of the metal oxide active layer. The light-sensing transistor is configured to convert a light intensity signal of the interactive light into an electrical signal. The position-detecting circuit is electrically connected to the light-sensing circuit and is configured to identify a position where the interactive light is irritated according to the electrical signal. Due to the upconversion material layer, the interactive light is converted from the first wave band into the second wave band, so that it can be absorbed by the metal oxide active layer. Thus, the metal oxide active layer can convert the light intensity signal of the interactive light having relatively long wavelengths into the electrical signal. After that, the position-detecting circuit identifies the position where the interactive light is irradiated according to the electrical signal. Therefore, the display device can interact with light having relatively long wavelengths, and a following technical problem is alleviated: a wavelength range of interactable light of conventional display panels is relatively narrow.

DESCRIPTION OF DRAWINGS

The accompanying figures to be used in the description of embodiments of the present disclosure or prior art will be described in brief to more clearly illustrate the technical solutions of the embodiments or the prior art. Apparently, the accompanying figures described below are only part of the embodiments of the present disclosure, from which figures those skilled in the art can derive further figures without making any inventive efforts.

DETAILED DESCRIPTION

Figure 1:
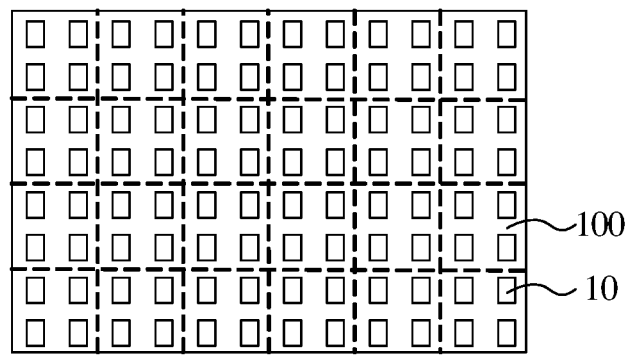
FIG. 1 is a plan structural schematic view showing a display panel according to an embodiment of the present disclosure.

The following description of the various embodiments is provided with reference to the accompanying drawings to demonstrate that the embodiments of the present disclosure may be implemented. It should be understood that terms such as "upper," "lower," "front," "rear," "left," "right," "inside," "outside," "lateral" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In the drawings, the identical or similar reference numerals constantly denote the identical or similar elements or elements having the identical or similar functions.

An embodiment of the present disclosure provides a display panel and a display device to alleviate a following technical problem: a wavelength range of interactable light of conventional display panels is relatively narrow.

As shown in FIG. 1, an embodiment of the present disclosure provides a display panel, including a plurality of light-sensing areas 100 arranged in an array manner. The display panel includes an upconversion material layer, a light-sensing circuit, and a position-detecting circuit. The light-sensing circuit is configured to absorb interactive light emitted from an interactive light source and convert the interactive light from a first wave band into a second wave band. The second wave band is less than the first wave band. The light-sensing circuit is disposed in the light-sensing areas 100 and includes a light-sensing transistor. The light-sensing transistor includes a substrate, a metal oxide active layer, a gate insulating layer, a gate layer, and a source/drain layer. The upconversion material layer is disposed between the interactive light source and the metal oxide active layer. The second wave band is within an absorption band of the metal oxide active layer. The light-sensing transistor is configured to convert a light intensity signal of the interactive light into an electrical signal. The position-detecting circuit is electrically connected to the light-sensing circuit and is configured to identify a position where the interactive light is irradiated according to the electrical signal.

The display panel includes a display area and a non-display area, a plurality of pixels 10 and the light-sensing areas 100 are arranged in the array manner in the display area. Each of the light-sensing areas 100 has a same size and a same shape and corresponds to one or more of the pixels 10. The size of the light-sensing areas 100 may be determined according to an intensity of interactive light irradiated on the display panel. The fewer the number of the pixels 10 corresponding to the light-sensing areas 100, the higher the sensing accuracy, and the better the interactive effect.

Typically, the interactive light source is a laser pointer or other devices that can emit interactive light. Interactive light emitted from the interactive light source has relatively long wavelengths longer than a maximum absorption wavelength of a metal oxide active layer 14, and the interactive light may be visible light or near infrared light.

A plurality of light-sensing circuits are disposed in the light-sensing areas 100. That is, each of the light-sensing areas 100 is provided with one light-sensing circuit. Each of the light-sensing circuits includes a light-sensing transistor, and an upconversion material layer is disposed between a metal active layer of the light-sensing transistor and the interactive light source. The interactive light emitted from the interactive light source is converted by the upconversion material layer. When the interactive light is emitted on some light-sensing transistors of the light-sensing areas 100, the light-sensing transistors may convert a light intensity signal of the corresponding interactive light into an electrical signal. The light-sensing areas 100 irradiated with the interactive light will generate electrical signals, and the light-sensing areas 100 not irradiated with the interactive light will not generate electrical signals. Therefore, a position-detecting circuit may identify a position where the interactive light is irradiated according to the electrical signal.

In actual irradiation, the interactive light may be emitted on multiple adjacent light-sensing areas 100 at the same time. The light-sensing areas 100 irradiated with the interactive light will generate the electrical signals. Light intensities received by different light-sensing areas 100 are different, and therefore intensities of electrical signals are different. The greater the area emitted with light, the stronger the electrical signals generated. The position-detecting circuit may identify the light-sensing areas 100 having the strongest electrical signal as a position where the interactive light is irradiated.

Figure 2:
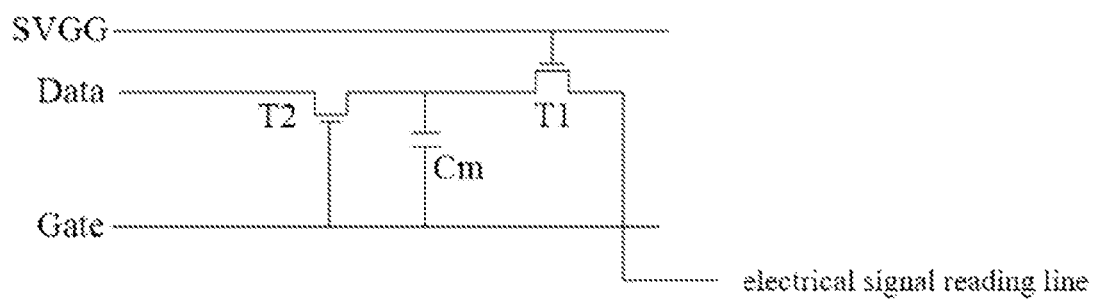
FIG. 2 is a first structural schematic view showing a light-sensing circuit of the display panel according to an embodiment of the present disclosure.

As shown in FIG. 2, a first structural schematic view showing the light-sensing circuit of the display panel according to the present embodiment is provided. The light-sensing circuit includes a light-sensing transistor T1 and a first switch transistor T2, a gate of the light-sensing transistor T1 is connected to a scan signal line (Gate). A first electrode of the light-sensing transistor T1 is connected to a high potential power signal line (VDD). A second electrode of the light-sensing transistor T1 is connected to a gate of the first switch transistor T1. A first electrode of the first switch transistor T2 is connected to the high potential power signal line (VDD). A second electrode of the first switch transistor T2 is connected to an electrical signal reading line, and the electrical signal reading line is connected to the position-detecting circuit. One of the first electrode or the second electrode of each of the transistors is a source, and the other is a drain.

When the light-sensing circuit works, the scan signal line (Gate) inputs a negative voltage to the gate of the light-sensing transistor T1, and the high potential power signal line (VDD) inputs a positive voltage to the first electrode of the light-sensing transistor. When the interactive light is not irradiated, the light-sensing transistor T2 is turned off. Therefore, there is no signal transmitted to the first switch transistor T2. Also, the first switch transistor T2 is also turned off. On the other hand, when the light-sensing transistor T1 is irradiated with interactive light emitted from the interactive light source, the light-sensing transistor T1 is turned on. Therefore, the electrical signal reading line may read a voltage of the high potential power signal line (VDD). Because the electrical signal reading line is connected to the position-detecting circuit, the position-detecting circuit may identify a position where the interactive light is irradiated according to the voltage read by the position-detecting circuit.

In one embodiment, the position-detecting circuit includes an integrator configured to integral currents flowing through the integrator, and a position where the interactive light is irradiated can be identified according to an integral result.

Figure 4:
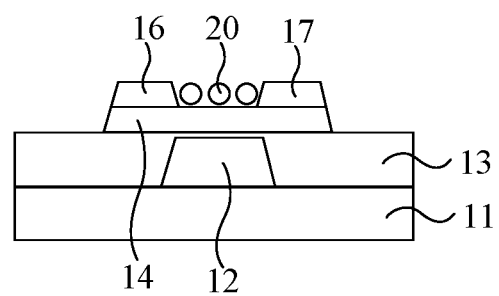
FIG. 4 is a first schematic view showing a position of an upconversion material layer in the display panel according to an embodiment of the present disclosure.
Figure 4:
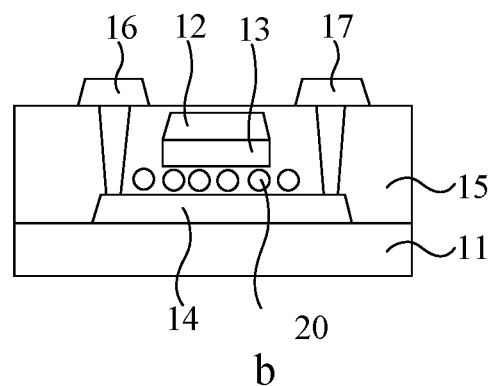

FIG. 4 is a first schematic view showing a position of an upconversion material layer in the display panel. The light-sensing transistor T1 includes a substrate 11, a gate insulating layer 13, and a source/drain layer, which are stacked. One of a gate layer or a metal oxide active layer 14 is disposed between the substrate 11 and the gate insulating layer 13, and the other is disposed between the gate insulating layer 13 and the source/drain layer. The upconversion material layer 20 is disposed in the light-sensing transistor T1 and is disposed on a side of the metal oxide active layer 14 away from the substrate 11.

In one embodiment, the light-sensing transistor T1 has a bottom-gate structure. As shown in FIG. 4a, the light-sensing transistor T1 includes a substrate 11, a gate layer, a gate insulating layer 13, a metal oxide active layer 14, and a source/drain layer. The gate layer is patterned to form a gate 12 of the light-sensing transistor T1, the source/drain layer is patterned to form a source 16 and a drain 17 of the light-sensing transistor T1, and the upconversion material layer 20 is disposed on the metal oxide active layer 14.

In one embodiment, the light-sensing transistor T1 has a top-gate structure. As shown in FIG. 4b, the light-sensing transistor T1 includes a substrate 11, a metal oxide active layer 14, a gate insulating layer 13, a gate layer, an interlayer insulating layer 15, and a source/drain layer. The gate layer is patterned to form a gate 12 of the light-sensing transistor T1, the source/drain layer is patterned to form a source 16 and a drain 17 of the light-sensing transistor. The upconversion material layer 20 is disposed between the metal oxide active layer 14 and the gate insulating layer 13. In addition, the upconversion material layer 20 may also be disposed on a side of the gate layer away from the gate insulating layer 13.

The upconversion material layer 20 is configured to absorb interactive light emitted from the interactive light source and convert the interactive light from a first wave band into a second wave band. The second wave band is less the first wave band and is within an absorption band of the metal oxide active layer 14.

Figure 7:
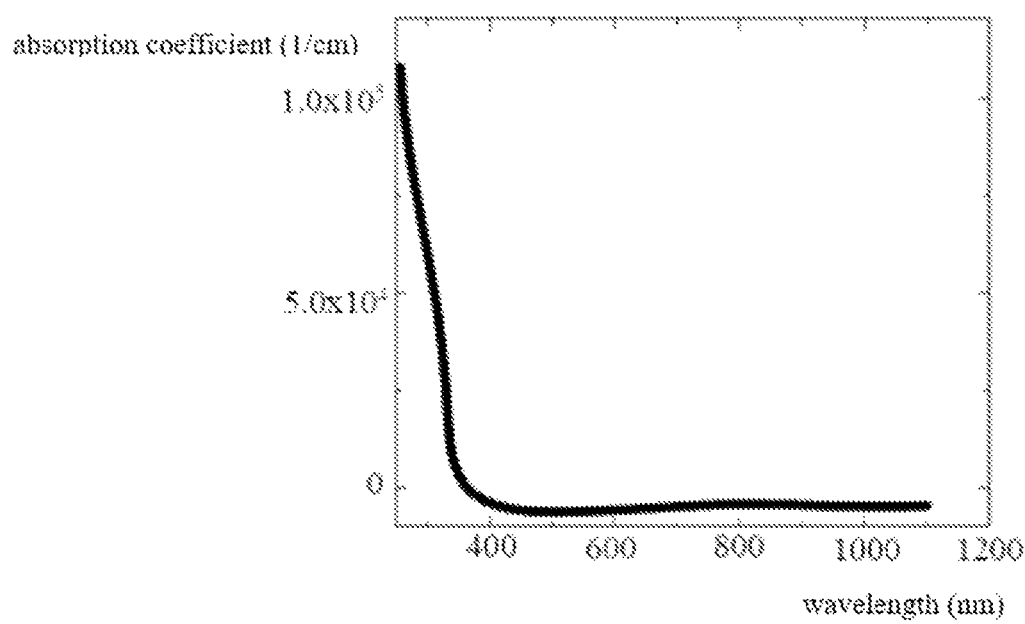
FIG. 7 is an absorption spectrum of a metal oxide active layer of the display panel according to an embodiment of the present disclosure.

FIG. 7 is an absorption spectrum of the metal oxide active layer 14, wherein a horizontal axis denotes a wavelength, and a vertical axis denotes an absorbance coefficient. As shown in FIG. 4, the absorbance coefficient of the metal oxide active layer 14 gradually decreases along with an increase of the wavelength. Specifically, the metal oxide active layer 14 can only absorb light with wavelengths shorter than 400 nm, and has a relatively weak capability to absorb light with wavelengths longer than 400 nm.

The upconversion material layer 20 may perform upconversion luminescence (anti-stokes luminescence). Specifically, a material is excited by light having low energy to emit light having high energy. That is, the material is excited by light having long wavelengths and low frequencies to emit light having short wavelengths and high frequencies.

Figure 8:
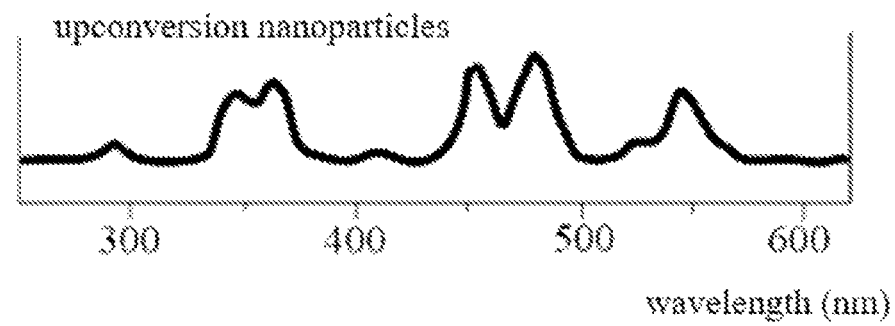
FIG. 8 is a schematic view showing lightwave conversion of upconversion material layers doped with different rare-earth elements.

The upconversion material includes a plurality of upconversion particles doped with a rare-earth element. As shown in FIG. 8, a schematic view showing lightwave conversion of upconversion material layers doped with different rare-earth elements is provided. Based on different rare-earth elements doped in the upconversion material layer, a wave band of 450 nm to 650 nm may be converted into a wave band of 300 nm to 400 nm, a wave band of 808 nm may be converted into a wave band of 550 nm, or other wave bands having long wavelengths may be converted into a wave band of 400 nm to 500 nm. Due to properties of the upconversion material, ambient infrared light having wave band of 780 nm to 980 nm may be converted into light having wave band of 300 nm to 400 nm that can be sensed by the metal oxide active layer 14. Therefore, the metal oxide active layer 14 may interact with visible light and infrared light.

Figure 9:
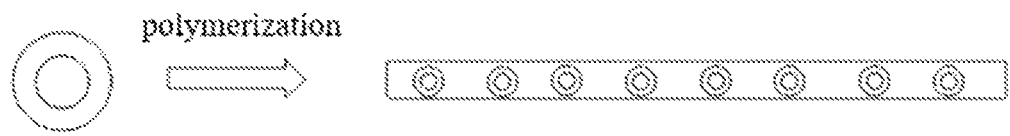
FIG. 9 is a schematic view showing a film-forming process of the upconversion material layer of the display panel according to an embodiment of the present disclosure.

In the present disclosure, the upconversion material layer 20 includes the upconversion nanoparticles doped with a lanthanide including NaYF4:Yb, Tm, Er, and mass fractions of Yb, Tm, and Er are 25%, 0.5%, and 0.1%, respectively. When the upconversion material layer 20 is formed, as shown in FIG. 9, the above particles are mixed in polymethylmethacrylate (PMMA). Then, a film is formed from a polymer by solution spin coating processes and photopolymerization. The film manufactured in the present disclosure is a complete film. Also, the film may be patterned according to different requirements of shapes and properties.

Figure 10:
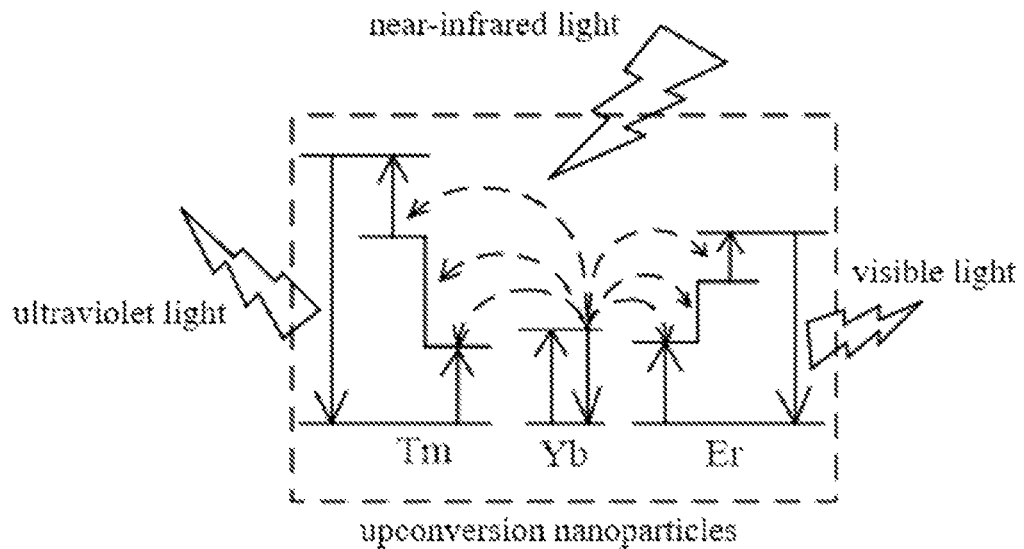
FIG. 10 is a schematic view showing a light conversion principle of the upconversion material layer of the display panel according to an embodiment of the present disclosure.

As shown in FIG. 10, when the upconversion material layer 20 is irradiated with near-infrared light, Yb is excited to a higher energy level after absorbing the near-infrared light. Then, energy of the Yb is transferred to Tm or Er, making them be excited to a higher energy level. After that, each element transitions to a ground state, and ultraviolet light or visible light is emitted during this process. In addition, if the upconversion material layer 20 is irradiated with visible light, ultraviolet light may also be obtained during the above process. The upconversion material layer 20 is disposed between the interactive light source and the metal oxide active layer 14. Wavelengths of near-infrared light emitted from the interactive light source are within the first wave band, and wavelengths of ultraviolet light converted from the upconversion material layer 20 are within the second wave band and are within the absorption band of the metal oxide active layer 14. As a result, a photocurrent may be generated in the metal oxide active layer 14, and a light intensity signal is converted into an electrical signal.

In the present disclosure, the upconversion material layer 20 is disposed between the interactive light source and the metal oxide active layer 14 in the light-sensing transistor T1 of the light-sensing circuit. Therefore, the interactive light having relatively long wavelengths is converted into light having relatively short wavelengths to be absorbed by the metal oxide active layer 14. Thus, not only can electron mobility and stability be ensured, but also visible light and near-infrared light having relatively long wavelengths can be absorbed. As a result, display panels having touch control function and capability to interact with long-wavelength light are realized, and interactive properties and additional values of the display panels are significantly improved.

In one embodiment, the light-sensing transistor T1 has a top-gate structure. The gate layer includes a transparent conductive material. When the interactive light is emitted on the gate layer, the interactive light can pass through the transparent gate layer and be emitted on the metal oxide active layer 14. Thus, the metal oxide active layer 14 can absorb more light. Correspondingly, a generated electrical signal can be stronger, the light-sensing transistor T1 is easier to be turned on, and detecting sensitivity is improved.

In one embodiment, a material of the metal oxide active layer 14 includes at least one of indium tin oxide, indium zinc oxide, indium gallium zinc oxide, indium zinc tin oxide, or indium gallium zinc tin oxide.

In one embodiment, a projection of the metal oxide active layer 14 on the substrate 11 is within a projection of the upconversion material layer 20 on the substrate 11. Therefore, the greater the area of the upconversion material layer 20, the stronger the capability of the upconversion material layer 20 to convert light. Correspondingly, the metal oxide active layer 14 can absorb more light, a generated electrical signal can be stronger, the light-sensing transistor T1 is easier to be turned on, and detecting sensitivity is improved.

Figure 5:
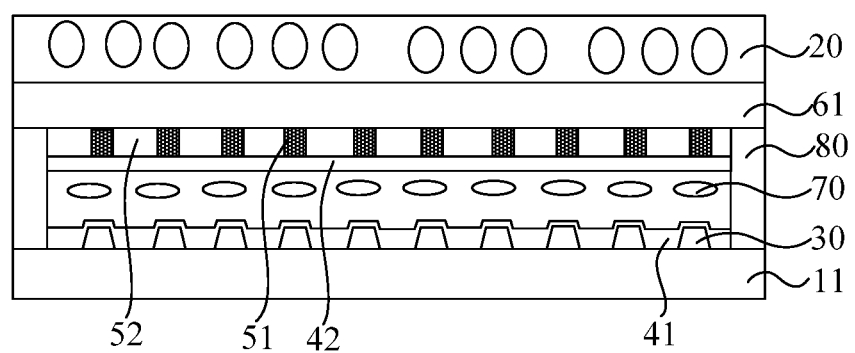
FIG. 5 is a second schematic view showing a position of an upconversion material layer in the display panel according to an embodiment of the present disclosure.
Figure 6:
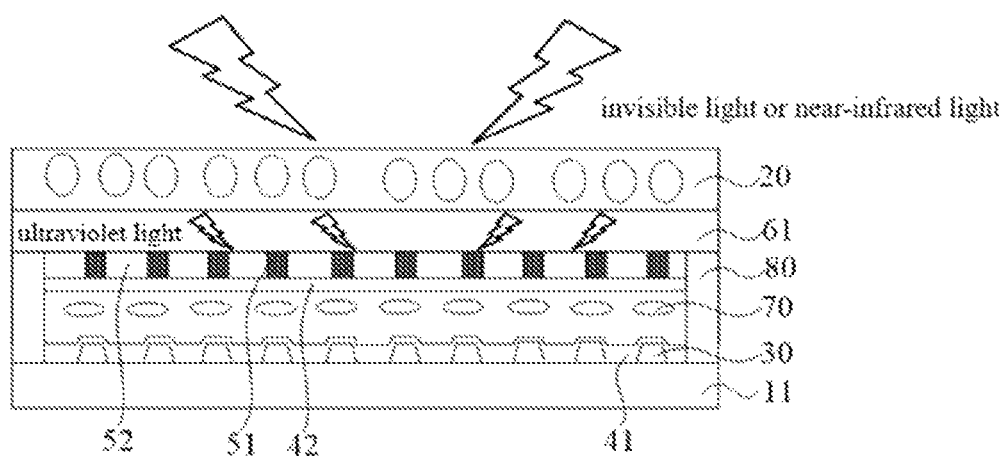
FIG. 6 is a mechanism diagram illustrating light conversion in the structure shown in FIG. 5.

In the above embodiments, the upconversion material layer 20 is disposed in the light-sensing transistor T1, but is not limited thereto. In one embodiment, as shown in FIG. 5, the upconversion material layer 20 is disposed on a light-emitting surface of the display panel. The display panel may be a liquid crystal display (LCD) panel or an organic light-emitting diode (OLED) display panel. Taking the LCD panel as an instance, the LCD panel includes an array substrate and a color filter substrate opposite to each other and a plurality of liquid crystals 70 disposed therebetween. The array substrate and the color filter substrate may be attached to each other by a sealant 80. The array substrate includes a substrate 11, a driving circuit layer 30, and a first alignment layer 41. The color filter substrate includes a substrate 61, a plurality of matrices 51, a coloresist layer 52, and a second alignment layer 42. Light generated by the display panel is emitted from bottom to top, and the upconversion material layer 20 is disposed on the light-emitting surface of the display panel. As shown in FIG. 6, since the upconversion material layer 20 is disposed on the light-emitting surface of the display panel, visible light or near-infrared light having relatively long wavelengths can be converted into ultraviolet light having relatively short wavelengths. Then, the ultraviolet light can be absorbed by the metal oxide active layer, and a light intensity signal to can be converted into an electrical signal.

In one embodiment, the display panel includes the array substrate, and the light-sensing circuit and pixel driving circuit configured to drive pixels are disposed in the array substrate. The light-sensing circuit and the pixel driving circuit are independent and work individually. As shown in FIG. 5 and FIG. 6, the light-sensing circuit 30 and the pixel-driving circuit (not shown) are formed in a driving circuit.

In one embodiment, multiple light-sensing circuits form a light-sensing layer disposed on the light-emitting side of the display panel and electrically connected to the display panel. The light-sensing layer has a plug-in structure. Multiple light-sensing circuits are integrated on a glass substrate to form the light-sensing layer disposed on the light-emitting surface of the display panel. If the above arrangement is applied, the light-sensing layer is easy to be changed when it malfunctions. Furthermore, the light-sensing layer may not be provided if an optical touch function is not necessary, thereby reducing a thickness of the display panels. In addition, the upconversion material layer 20 may be disposed in the light-sensing layer or on a light-emitting surface of the light-sensing layer.

Figure 3:
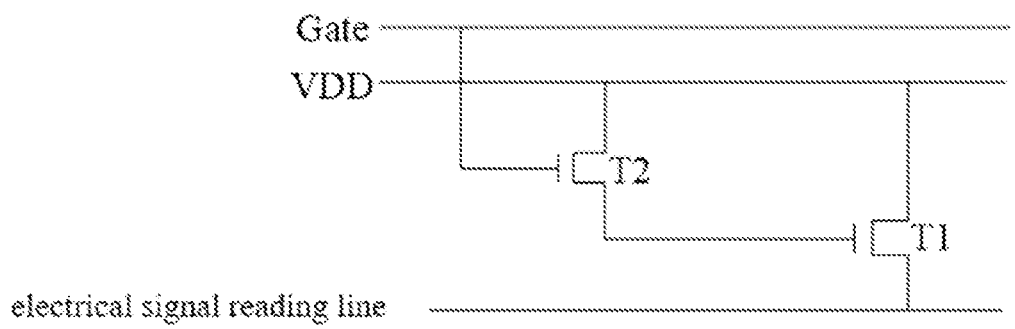
FIG. 3 is a second structural schematic view showing a light-sensing circuit of the display panel according to an embodiment of the present disclosure.

As shown in FIG. 3, a second structural schematic view showing the light-sensing circuit of the display panel is provided. The light-sensing circuit includes a first light-sensing transistor T1, a second switch transistor T3, and a storage capacitor Cm. A gate of the light-sensing transistor T1 is connected to a scan signal line (Gate), a first electrode of the light-sensing transistor T1 is connected to a first data signal line (Data), a second electrode of the light-sensing transistor T1 is connected to a first electrode of the second switch transistor T3, a gate of the second switch transistor T3 is connected to a second data signal line (SVGG), a second electrode of the second switch transistor (T3) is connected to an electrical signal reading line, a first electrode of the storage capacitor (Cm) is connected to the first data signal line (Data), a second electrode of the storage capacitor (Cm) is connected to the second electrode of the light-sensing transistor T1, and the electrical signal reading line is connected to the position-detecting circuit. One of the first electrode or the second electrode of each of the transistors is a source, and the other is a drain.

When the light-sensing circuit works, the scan signal line (Gate) inputs a negative voltage to the gate of the light-sensing transistor T1, and the first data signal line (Data) inputs a first data signal to the first electrode of the light-sensing transistor T1. When the interactive light is not irradiated, the light-sensing transistor T1 is turned off, and electric charges in the storage capacitor (Cm) remains unchanged. On the other hand, When the light-sensing transistor T1 is irradiated with interactive light emitted from the interactive light source, the light-sensing transistor T1 is turned on. Therefore, a first voltage of the second switch transistor T3 receives the first data signal transmitted from the first data signal line (Data), and the electric charges in the storage capacitor (Cm) changes to store the first data signal. The gate of the second switch transistor T3 is connected to the second data signal line (SVGG). The second data signal line (SVGG) transmits a second data signal to the display panel row by row or column by column. When the second data signal corresponding to the light-sensing circuit is at a high voltage, the second switch transistor (T3) is turned on. Therefore, the electrical signal reading line can read the voltage of the second data signal. Because the electrical signal reading line is connected to the position-detecting circuit, the position-detecting circuit can identify a position where the interactive light is irradiated according to the voltage read by the electrical signal reading line.

In the present embodiment, the structure of the light-sensing transistor T1 is same as it shown in FIG. 2, and a working principle after irradiation is same as the above embodiment.

In the above embodiments, due to the upconversion material layer 20, the display panel can interact with light having relatively long wavelengths. In addition, a quantum-dot layer may also be provided in the display panel to achieve the same effect.

In one embodiment, the display panel includes a plurality of light-sensing areas 100, a light-sensing circuit, and a position-detecting circuit. The light-sensing circuit is disposed in the light-sensing areas 100. The light-sensing circuit includes a light-sensing transistor. The light-sensing transistor includes a substrate, a metal oxide active layer, a gate layer, a source/drain layer, and a quantum-dot layer. The quantum-dot layer is in contact with the metal oxide active layer and is configured to absorb interactive light emitted from an interactive light source. Wavelengths of the interactive light are longer than a maximum absorption wavelength of a metal oxide active layer 14. The light-sensing transistor is configured to convert a light intensity of the interactive light into an electrical signal. The position-sensing circuit is electrically connected to the light-sensing circuit and is configured to identify a position where the interactive light is irradiated according to the electrical signal.

In the embodiment, structures of the light-sensing circuit and the position-detecting circuit may be referred to the structures shown in FIG. 2 and FIG. 3, and working principles thereof may be same as the above embodiments as well. The only difference between the present embodiment and the above embodiments is: a structure of the light-sensing transistor T1.

In one embodiment, the light-sensing transistor T1 has a bottom-gate structure. The light-sensing transistor T1 includes a substrate 11, a gate layer, a gate insulating layer 13, a metal oxide active layer 14, and a source/drain layer, which are stacked. The gate layer is patterned to form a gate 12 of the light-sensing transistor T1. The source/drain layer is patterned to form a source 16 and a drain 17 of the light-sensing transistor T1. The quantum-dot layer is disposed on at least one of a side of the metal oxide active layer 14 near the gate insulating layer 13 or a side of the metal oxide active layer 14 near the source/drain layer.

In one embodiment, the light-sensing transistor T1 has a top-gate structure. The light-sensing transistor T1 includes a substrate 11, a metal oxide active layer 14, a gate insulating layer 13, a gate layer, an interlayer insulating layer 15, and a source/drain layer, which are stacked. The gate layer is patterned to form a gate 12 of the light-sensing transistor T1. The source/drain layer is patterned to form a source 16 and a drain 17 of the light-sensing transistor T1. The quantum-dot layer is disposed on at least one of a side of the metal oxide active layer 14 near the substrate 11 or a side of the metal oxide active layer 14 near the gate insulating layer 13.

The quantum-dot layer includes a plurality of quantum dots. According to nanoconfinement effect, the quantum dots have an extremely narrow bandgap and a very high color purity, which can significantly broaden a color gamut of the display panel. Moreover, a size of the quantum dots may be adjusted to adjust an amount of visible light being absorbed.

The quantum-dot layer is directly in contact with the metal oxide active layer 14 and is disposed on at least one of a top side of a bottom side of the metal oxide active layer 14. A band gap of the metal oxide active layer 14 is relatively long, and therefore the metal oxide active layer 14 can only absorb ultraviolet light having relatively short wavelengths, but cannot absorb visible light. On the contrary, a band gap of the quantum-dot layer is relatively low, and therefore the quantum-dot layer can absorb visible light or near-infrared light having relatively long wavelengths. After the quantum dots absorb interactive light having relatively long wavelengths, electrons of the quantum dots transition from a valence band a conduction band. Because the quantum-dot layer is in contact with the metal oxide active layer 14, the electron in the conduction band may be injected to a conduction band of the metal oxide active layer 14. A photocurrent can be formed between the source 16 and the drain 17 of the light-sensing transistor T1 under bias voltage. Therefore, a light intensity signal is converted into an electrical signal.

In the present embodiment, the quantum-dot layer and the metal oxide active layer 14 are combined in the light-sensing transistor T1 of the light-sensing circuit. Therefore, under a condition that electron mobility and stability are not affected, invisible light and near-infrared light having relatively long wavelengths can be absorbed. As a result, display panels having touch control function and capability to interact with long-wavelength light, and interactive properties and additional values of the display panels are significantly improved.

In one embodiment, the quantum-dot layer includes a plurality of cadmium selenide quantum dots, but is not limited thereto. The quantum-dot layer may also include other types of quantum-dots.

In one embodiment, a projection of the metal oxide active layer 14 on the substrate 11 is within a projection of the quantum-dot layer on the substrate 11. Specifically, an area of the quantum-dot layer is bigger than an area of the metal oxide active layer 14. After the quantum dots absorb interactive light, electrons of the quantum-dots will transition from a valence band a conduction band, and the electrons in the conduction band will be injected to a conduction band of the metal oxide active layer 14. Correspondingly, a generated electrical signal will be stronger, the light-sensing transistor T1 is easier to be turned on, and detecting sensitivity is improved.

Similarly, the display panel in the present embodiment may be the LCD panel or the OLED display panel. In one embodiment, the display panel includes the array substrate, and the light-sensing circuit and the pixel driving circuit configured to drive pixels are disposed in the array substrate. The light-sensing circuit and the pixel driving circuit are independent and work individually.

In one embodiment, multiple light-sensing circuits form a light-sensing layer disposed on the light-emitting side of the display panel and electrically connected to the display panel. The light-sensing layer has a plug-in structure. Multiple light-sensing circuits are integrated on a glass substrate to form the light-sensing layer disposed on the light-emitting side of the display panel. If the above arrangement is applied, the light-sensing layer is easy to be changed when it malfunctions. Furthermore, the light-sensing layer may not be provided if an optical touch function is not necessary, thereby reducing a thickness of the display panels.

The present disclosure further includes a display device, including a display panel and a driver chip, wherein the display panel is any one of the above-mentioned display panels. In the display device provided by the present disclosure, due to the upconversion material layer, the interactive light is converted from the first wave band into the second wave band that can be absorbed by the metal oxide active layer. Thus, the metal oxide active layer can convert the light intensity signal of the interactive light having relatively long wavelength into the electrical signal. After that, the position-detecting circuit identifies the position where the interactive light is irradiated. Therefore, the display device can interact with light having relatively long wavelengths, and a following technical problem is alleviated: a wavelength range of interactable light of conventional display panels is relatively narrow.

According to the above embodiments, the present disclosure provides a display panel and a display device. The display panel includes the upconversion material layer, the light-sensing circuit, and the position detecting circuit. The upconversion material layer is configured to absorb interactive light emitted from the interactive light source and convert the interactive light from the first wave band into the second wave band, and the second wave band is less than the first wave band. The light-sensing circuit is disposed in the light-sensing areas and includes the light-sensing transistor, the light-sensing transistor includes the substrate, the metal oxide active layer, the gate insulating layer, the gate layer, and the source/drain layer. The upconversion material layer is disposed between the interactive light source and the metal oxide active layer, the second wave band is within an absorption band of the metal oxide active layer, and the light-sensing transistor is configured to convert the light intensity signal of the interactive light into the electrical signal. The position-detecting circuit is electrically connected to the light-sensing circuit and is configured to identify a position where the interactive light is irradiated. Due to the upconversion material layer, the interactive light is converted from the first wave band into the second wave band that can be absorbed by the metal oxide active layer. Thus, the metal oxide active layer can convert the light intensity signal of the interactive light having relatively long wavelength into the electrical signal. After that, the position-detecting circuit identifies the position where the interactive light is irradiated. Therefore, the display device can interact with light having relatively long wavelengths, and a following technical problem is alleviated: a wavelength range of interactable light of conventional display panels is relatively narrow.

In the above embodiments, the focus of each embodiment is different, and for a part that is not detailed in an embodiment, reference may be made to related descriptions of other embodiments.

A display panel and a display device have been described in detail with embodiments provided by the present disclosure which illustrates principles and implementations thereof. However, the description of the above embodiments is only for helping to understand the technical solution of the present disclosure and core ideas thereof, and it is understood by those skilled in the art that many changes and modifications to the described embodiment can be carried out without departing from the scope and the spirit of the disclosure that is intended to be limited only by the appended claims.

What is claimed is:

1. A display panel, comprising a plurality of light-sensing areas arranged in an array manner, wherein the display panel comprises:
an upconversion material layer, wherein the upconversion material layer is configured to absorb interactive light emitted from an interactive light source and convert the interactive light from a first wave band into a second wave band, and the second wave band is less than the first wave band;
a light-sensing circuit, wherein the light-sensing circuit is disposed in the plurality of light-sensing areas and comprises a light-sensing transistor, the light-sensing transistor comprises a substrate, a metal oxide active layer, a gate insulating layer, a gate layer, and a source/drain layer, the upconversion material layer is disposed between the interactive light source and the metal oxide active layer, the second wave band is within an absorption band of the metal oxide active layer, and the light-sensing transistor is configured to convert a light intensity signal of the interactive light into an electrical signal, wherein the substrate, the gate insulating layer, and the source/drain layer, which are stacked, one of the gate layer or the metal oxide active layer is disposed between the substrate and the gate insulating layer, and the other is disposed between the gate insulating layer and the source/drain layer, wherein the upconversion material layer is disposed in the light-sensing transistor and is disposed on a side of the metal oxide active layer away from the substrate; and
a position-detecting circuit, wherein the position-detecting circuit is electrically connected to the light-sensing circuit and is configured to identify a position where the interactive light is irradiated.

2. The display panel of claim 1, wherein the upconversion material layer includes an upconversion nanomaterial doped with a lanthanide.

3. The display panel of claim 2, wherein the upconversion nanomaterial doped with the lanthanide includes NaYF4:Yb, Tm, Er, and mass fractions of Yb, Tm, and Er are 25%, 0.5%, and 0.1%, respectively.

4. The display panel of claim 2, wherein the upconversion material layer further comprises polymethylmethacrylate.

5. The display panel of claim 1, wherein the upconversion material layer is disposed on a light-emitting surface of the display panel.

6. The display panel of claim 1, wherein a material of the metal oxide active layer includes at least one of indium tin oxide, indium zinc oxide, indium gallium zinc oxide, indium zinc tin oxide, or indium gallium zinc tin oxide.

7. The display panel of claim 1, wherein the light-sensing circuit further includes a first switch transistor, a gate of the light-sensing transistor is connected to a scan signal line, a first electrode of the light-sensing transistor is connected to a high potential power signal line, a second electrode of the light-sensing transistor is connected to a gate of the first switch transistor, a first electrode of the first switch transistor is connected to the high potential power signal line, a second electrode of the first switch transistor is connected to an electrical signal reading line, and the electrical signal reading line is connected to the position-detecting circuit.

8. The display panel of claim 1, wherein the light-sensing circuit further includes a second switch transistor and a storage capacitor, a gate of the light-sensing transistor is connected to a scan signal line, a first electrode of the light-sensing transistor is connected to a first data signal line, a second electrode of the light-sensing transistor is connected to a first electrode of the second switch transistor, a gate of the second switch transistor is connected to a second data signal line, a second electrode of the second switch transistor is connected to an electrical signal reading line, a first electrode of the storage capacitor is connected to the first data signal line, a second electrode of the storage capacitor is connected to the second electrode of the light-sensing transistor, and the electrical signal reading line is connected to the position-detecting circuit.

9. The display panel of claim 1, wherein the position-detecting circuit comprises an integrator.

10. The display panel of claim 1, wherein the display panel further includes an array substrate, and the light-sensing circuit is disposed in the array substrate.

11. The display panel of claim 1, wherein the plurality of light-sensing circuits form a light-sensing layer disposed on a light-emitting surface of the display panel and electrically connected to the display panel.

12. The display panel of claim 1, wherein the light-sensing areas correspond to one or more pixels.

13. A display device, comprising a display panel and a driver chip, wherein the display panel comprises:
an upconversion material layer, wherein the upconversion material layer is configured to absorb interactive light emitted from an interactive light source and convert the interactive light from a first wave band into a second wave band, and the second wave band is less than the first wave band;
a light-sensing circuit, wherein the light-sensing circuit is disposed in a plurality of light-sensing areas and comprises a light-sensing transistor, the light-sensing transistor comprises a substrate, a metal oxide active layer, a gate insulating layer, a gate layer, and a source/drain layer, the upconversion material layer is disposed between the interactive light source and the metal oxide active layer, the second wave band is within an absorption band of the metal oxide active layer, and the light-sensing transistor is configured to convert a light intensity signal of the interactive light into an electrical signal, wherein the substrate, the gate insulating layer, and the source/drain layer, which are stacked, one of the gate layer or the metal oxide active layer is disposed between the substrate and the gate insulating layer, and the other is disposed between the gate insulating layer and the source/drain layer, wherein the upconversion material layer is disposed in the light-sensing transistor and is disposed on a side of the metal oxide active layer away from the substrate; and
a position-detecting circuit, wherein the position-detecting circuit is electrically connected to the light-sensing circuit and is configured to identify a position where the interactive light is irradiated.

14. The display device of claim 13, wherein the upconversion material layer includes an upconversion nanomaterial doped with a lanthanide.

15. The display device of claim 14, wherein the upconversion nanomaterial doped with the lanthanide includes NaYF4:Yb, Tm, Er, and mass fractions of Yb, Tm, and Er are 25%, 0.5%, and 0.1%, respectively.

16. The display device of claim 13, wherein the light-sensing circuit further includes a first switch transistor, a gate of the light-sensing transistor is connected to a scan signal line, a first electrode of the light-sensing transistor is connected to a high potential power signal line, a second electrode of the light-sensing transistor is connected to a gate of the first switch transistor, a first electrode of the first switch transistor is connected to the high potential power signal line, a second electrode of the first switch transistor is connected to an electrical signal reading line, and the electrical signal reading line is connected to the position-detecting circuit.

17. The display device of claim 13, wherein the light-sensing circuit further includes a second switch transistor and a storage capacitor, a gate of the light-sensing transistor is connected to a scan signal line, a first electrode of the light-sensing transistor is connected to a first data signal line, a second electrode of the light-sensing transistor is connected to a first electrode of the second switch transistor, a gate of the second switch transistor is connected to a second data signal line, a second electrode of the second switch transistor is connected to an electrical signal reading line, a first electrode of the storage capacitor is connected to the first data signal line, a second electrode of the storage capacitor is connected to the second electrode of the light-sensing transistor, and the electrical signal reading line is connected to the position-detecting circuit.

* * * * *